(12) United States Patent
Choi et al.

(10) Patent No.: US 8,563,970 B2
(45) Date of Patent: Oct. 22, 2013

(54) ORGANIC LIGHT EMITTING DIODE DISPLAY

(71) Applicant: G&CS Co., Ltd, Seoul (KR)

(72) Inventors: Suk-Hong Choi, Seoul (KR); Sang-Hee Park, Bucheon-si (KR)

(73) Assignee: G&CS Co., Ltd (KR)

( * ) Notice: Subject to any disclaimer, the term of this patent is extended or adjusted under 35 U.S.C. 154(b) by 0 days.

(21) Appl. No.: 13/656,702

(22) Filed: Oct. 20, 2012

(65) Prior Publication Data

US 2013/0193415 A1    Aug. 1, 2013

(30) Foreign Application Priority Data

Jan. 30, 2012   (KR) ................. 10-2012-0008838

(51) Int. Cl.
*H01L 29/08*   (2006.01)
(52) U.S. Cl.
USPC ............................................. 257/40; 257/79

(58) Field of Classification Search
USPC ...................................... 257/40, 79
See application file for complete search history.

(56) References Cited

FOREIGN PATENT DOCUMENTS

| KR | 1020080082744 A | 9/2008 |
|---|---|---|
| KR | 1020110051611 A | 6/2011 |

*Primary Examiner* — Douglas Menz

(57) ABSTRACT

Disclosed is an organic light emitting diode display, including a first substrate including an organic light emitting diode and a driving circuit part for driving the light emitting diode, a second substrate facing the first substrate and covering the light emitting diode and the driving circuit part, a connection unit connected to the driving circuit part and extending from the first substrate along a rear side thereof, an electronic device disposed between the connection unit and the first substrate and transmitting a signal to the driving circuit part via the connection unit, and an electromagnetic wave-shielding sheet disposed on one side of the first substrate to directly face the electronic device and including a first conductive material layer, a buffer layer formed on one side of the first conductive material layer to prevent the first substrate from breaking, and a first adhesive layer formed on the other side of the first conductive material layer.

11 Claims, 9 Drawing Sheets

ORGANIC LIGHT EMITTING DIODE DISPLAY

BACKGROUND OF THE INVENTION

1. Field of the Invention

The present invention relates to an organic light emitting diode display, and particularly to an organic light emitting diode display including an organic light emitting diode.

2. Description of the Related Art

Displays are an apparatus that displays an image, and recently organic light emitting diode displays are receiving attention.

Organic light emitting diode displays have self-emission properties, and need no additional light source unlike liquid crystal displays, thus enabling the thickness and weight thereof to decrease. Furthermore, organic light emitting diode displays exhibit high quality properties including low power consumption, high luminance, and high reaction rates.

An organic light emitting diode display comprises a substrate including an organic light emitting diode having an organic light emitting layer and a driving circuit part for driving the organic light emitting diode, and an electronic device for transmitting a signal to the driving circuit part. The electronic device is disposed on the rear side of the substrate to allow the organic light emitting diode display to be thin.

However, in the case when the electronic device is disposed on the rear side of the substrate so that an organic light emitting diode display can be made slim, electromagnetic waves generated from the electronic device are transferred to the driving circuit part via the substrate and cause the driving circuit part to malfunction.

Also, in the case where the electromagnetic waves generated from the electronic device are transferred to the outside of the organic light emitting diode display via the substrate, these electromagnetic waves adversely affect the body of a user using the organic light emitting diode display.

Also, in the case where the organic light emitting diode display is made slim, it cannot absorb an external impact that is applied thereto, undesirably breaking the substrate.

SUMMARY OF THE INVENTION

Accordingly, the present invention has been made keeping in mind the above problems occurring in the related art, and an object of the present invention is to provide an electromagnetic wave-shielding sheet which may prevent electromagnetic waves generated from an electronic device from passing through a substrate, may dissipate heat generated from the display to the outside and may absorb impact, and an organic light emitting diode display including the same.

In order to accomplish the above object, an aspect of the present invention provides an organic light emitting diode display, comprising a first substrate including an organic light emitting diode and a driving circuit part for driving the organic light emitting diode, a second substrate disposed to face the first substrate and covering the organic light emitting diode and the driving circuit part, a connection unit connected to the driving circuit part and extending from the first substrate along a rear side thereof, an electronic device disposed between the connection unit and the first substrate and transmitting a signal to the driving circuit part via the connection unit, and an electromagnetic wave-shielding sheet disposed on one side of the first substrate to directly face the electronic device.

The electromagnetic wave-shielding sheet includes a first conductive material layer, a buffer layer formed on one side of the first conductive material layer to prevent the first substrate from breaking, and a first adhesive layer formed on the other side of the first conductive material layer.

The electromagnetic wave-shielding sheet may further include a second conductive material layer formed on the first adhesive layer using a material different from that of the first conductive material layer, and a second adhesive layer formed on the second conductive material layer.

The first conductive material layer may comprise at least one selected from the group consisting of gold (Au), silver (Ag), copper (Cu), aluminum (Al), titanium (Ti), indium tin oxide (ITO), indium zinc oxide (IZO), carbon nanotubes (CNTs), and graphite.

The graphite may have a density of 1.0~2.0 g/cm$^3$, and the heat conductivity of the graphite may be 400~1900 W/mK in a planar direction and 3~20 W/mK in a perpendicular direction.

The graphite may comprise exfoliated graphite and amorphous carbon particles having a particle size of 10~110 nm, and the amount of the amorphous carbon particles may be 5~30 wt % based on a total weight of the exfoliated graphite and the amorphous carbon particles.

The organic light emitting diode display may further comprise a reception unit which encloses at least a portion of the first substrate, and the reception unit may include a through bore through which the electronic device passes so that the electronic device and the first substrate face each other.

The connection unit facing the reception unit may be adhered to the reception unit using an adhesive.

The connection unit may be a flexible printed circuit board (FPCB).

The electromagnetic wave-shielding sheet may be formed using a deposition process, a plating process or a printing process.

Another aspect of the present invention provides an organic light emitting diode display, comprising a first substrate including an organic light emitting diode and a driving circuit part for driving the organic light emitting diode, a second substrate disposed to face the first substrate and covering the organic light emitting diode and the driving circuit part, a connection unit connected to the driving circuit part and extending from the first substrate along a rear side thereof, an electronic device disposed between the connection unit and the first substrate and transmitting a signal to the driving circuit part via the connection unit, an electromagnetic wave-shielding sheet disposed on one side of the first substrate to face the electronic device, a reception unit enclosing at least a portion of the first substrate, and a graphite sheet disposed on one side of the reception unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
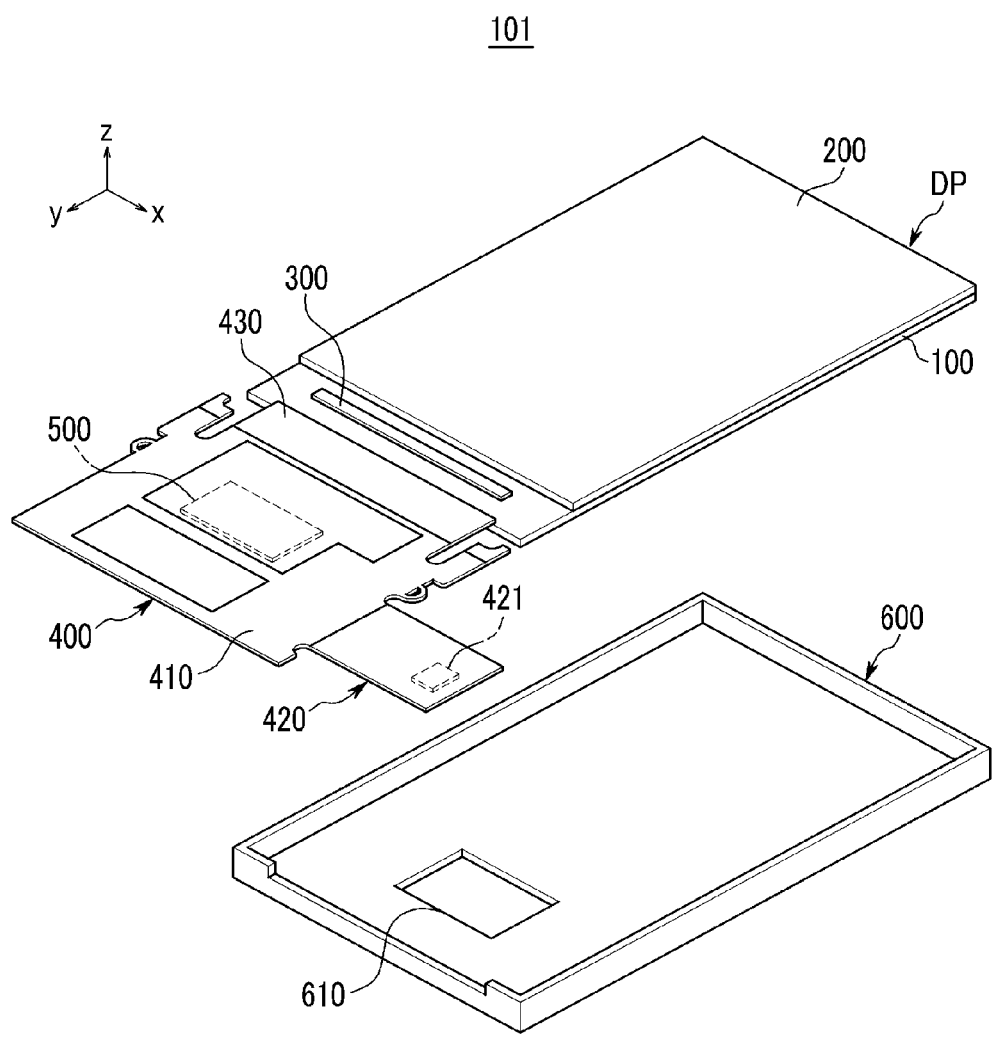
FIG. 1 is an exploded perspective view showing an organic light emitting diode display according to a first embodiment of the present invention.

Hereinafter, preferred embodiments of the present invention will be described in detail with reference to the attached drawings so that they may be easily practiced by those having ordinary knowledge in the art. The present invention may be embodied in a variety of different forms and is not limited to the embodiments described herein.

Throughout the drawings, the same reference numerals refer to the same or similar components, and redundant descriptions are omitted.

Further, for the sake of description, the sizes and thicknesses of respective components shown in the drawings are arbitrary, and the present invention is not necessarily limited thereto.

To definitively depict the layers and regions in the drawings, the thicknesses have been made larger. Also for the sake of description, the thicknesses of partial layers and regions are exaggeratingly illustrated. Furthermore, in the cases of elements such as layers, films, regions, plates, etc. throughout the description, the expression "disposed on" means not only that one element is directly disposed on another element but also that one element is indirectly disposed on another element with a further element being interposed therebetween.

Although an active matrix type organic light emitting diode display having a structure of 2Tr-1 Cap comprising two thin film transistors and one capacitor per pixel is illustrated in the appended drawings, the present invention is not limited thereto. Thus in the organic light emitting diode display, the number of thin film transistors, the number of capacitors and the number of lines are not limited. Meanwhile, pixels are a minimum unit that displays the image, and the organic light emitting diode display shows an image via a plurality of pixels.

Below, an organic light emitting diode display 101 according to a first embodiment of the present invention will be described with reference to FIGS. 1 to 5.

Figure 2:
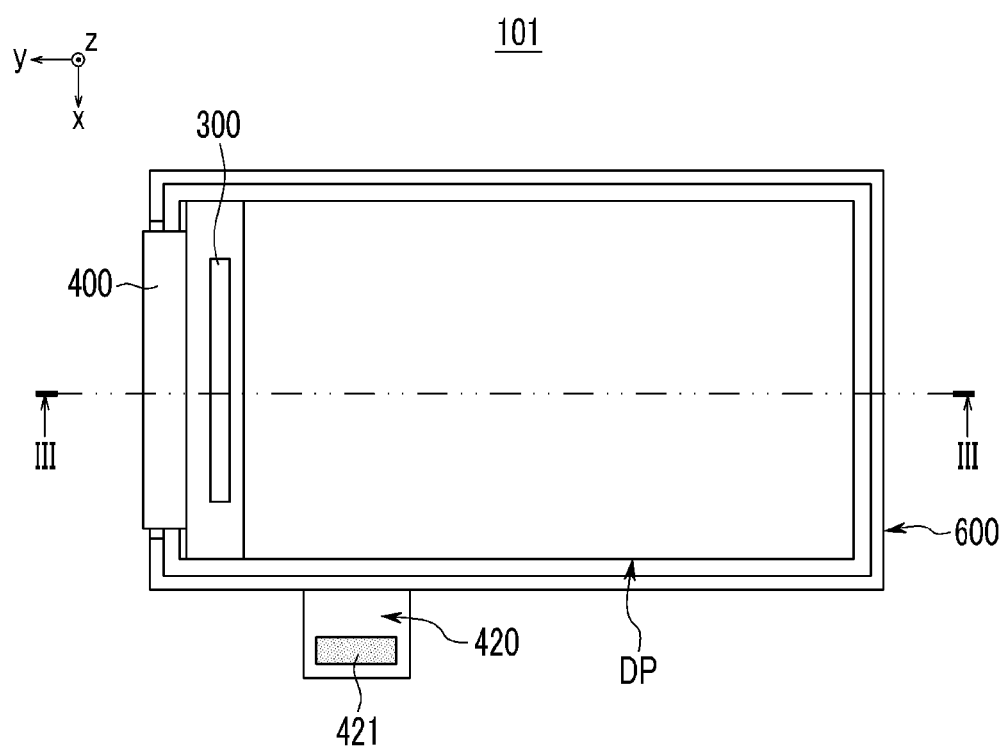
FIG. 2 is a top plan view showing the organic light emitting diode display of FIG. 1 which is in a state of being combined.
Figure 3:
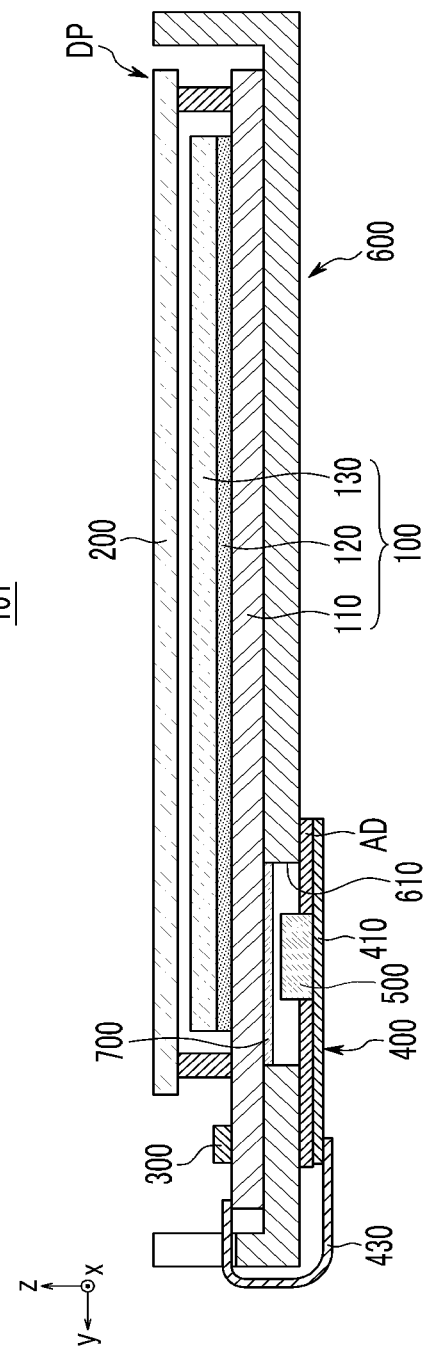
FIG. 3 is a cross-sectional view taken along the line III-III of FIG. 2.

FIG. 1 is an exploded perspective view showing the organic light emitting diode display according to the first embodiment of the present invention. FIG. 2 is a top plan view showing the organic light emitting diode display of FIG. 1 which is in a state of being combined. FIG. 3 is a cross-sectional view taken along the line III-III of FIG. 2;

As shown in FIGS. 1 to 3, the organic light emitting diode display 101 according to the first embodiment of the present invention comprises a first substrate 100, a second substrate 200, an integrated circuit chip 300, a connection unit 400, an electronic device 500, a reception unit 600, and an electromagnetic wave-shielding sheet 700 (FIG. 3).

The first substrate 100 includes a substrate body 110, a driving circuit part 120 and an organic light emitting diode 130.

The substrate body 110 is an insulating substrate made of glass, quartz, ceramic or plastic, but an embodiment of the present invention is not limited thereto. The substrate body 110 may be a metallic substrate made of stainless steel, etc.

Located between the substrate body 110 and the second substrate 200 are the driving circuit part 120 and the organic light emitting diode 130 which are sequentially formed on the substrate body 110.

The driving circuit part 120 includes first and second thin film transistors 10, 20 (FIG. 4), and drives the organic light emitting diode 130. The organic light emitting diode 130 emits light in response to a driving signal transmitted from the driving circuit part 120.

The second substrate 200 is smaller than the first substrate 100, and covers the first substrate 100. The second substrate 200 is an insulating substrate made of glass, quartz, ceramic or plastic. The second substrate 200 exposes the edge of the first substrate 100, and the integrated circuit chip 300 is mounted on the first substrate 100 so as to be adjacent to the second substrate 200 at the exposed edge of the first substrate 100. The second substrate 200 forms a display panel (DP) together with the first substrate 100.

Figure 4:
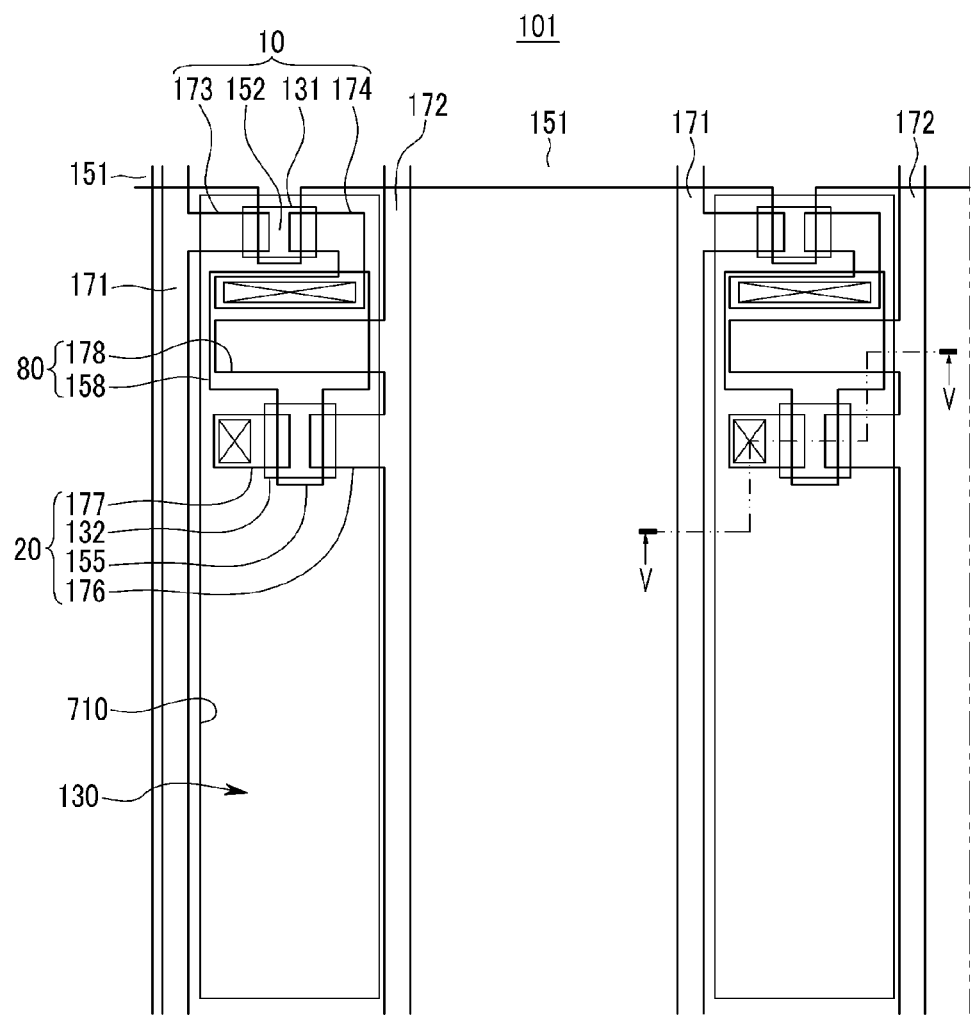
FIG. 4 is a view showing the pixel structure of a display panel in the organic light emitting diode display according to the first embodiment of the present invention.
Figure 5:
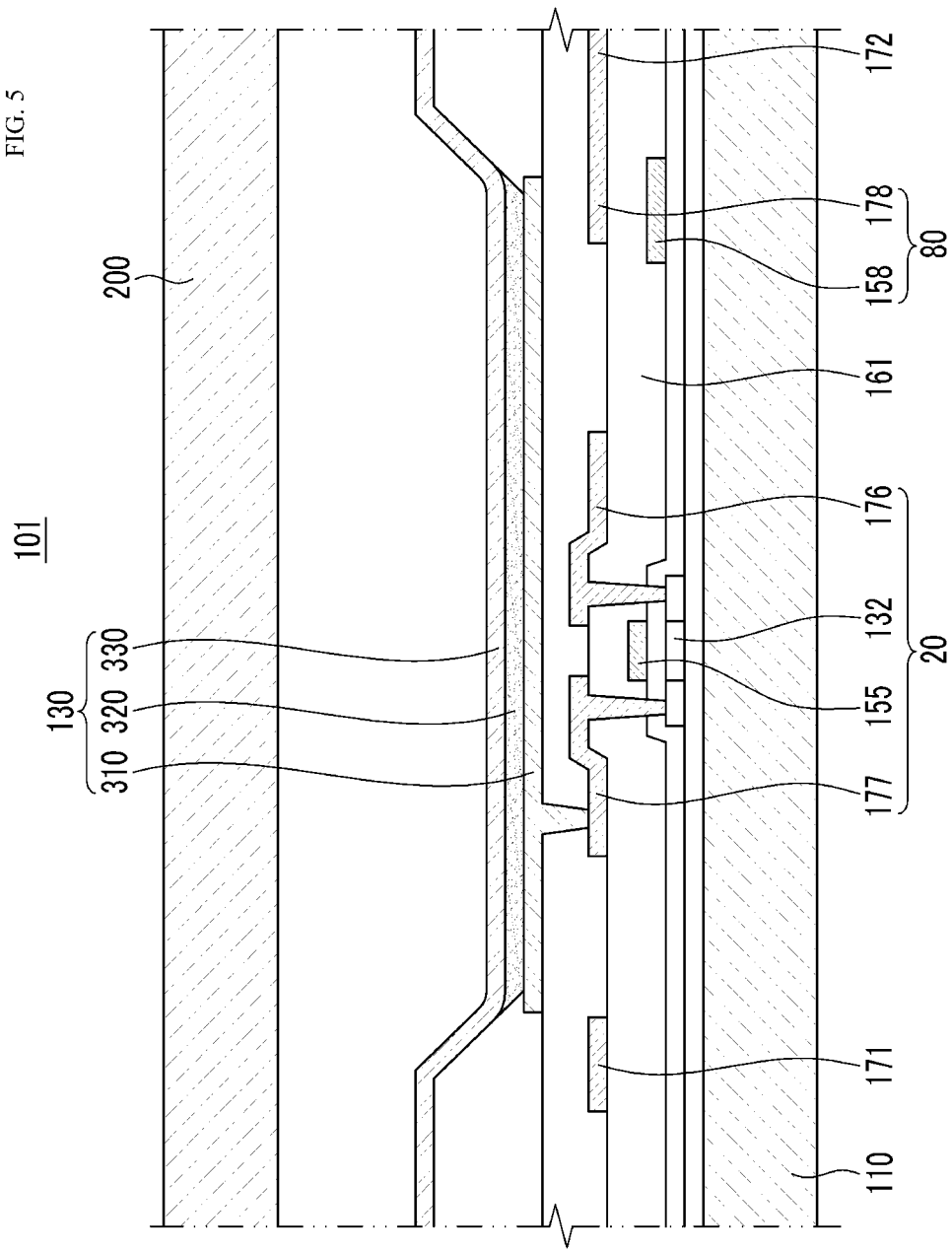
FIG. 5 is a cross-sectional view taken along the line V-V of FIG. 4.

With reference to FIGS. 4 and 5, the inner substrate of the display panel (DP) is specified below.

Although the specific structures of the organic light emitting diode 130 and the driving circuit part 120 which will be described in detail later are illustrated in FIGS. 4 and 5, embodiments of the present invention are not limited to the structures shown in FIGS. 4 and 5. The organic light emitting diode 130 and the driving circuit part 120 may be formed in a range of a variety of structures provided that they may be easily transformed by those skilled in the art.

FIG. 4 shows the pixel structure of the display panel in the organic light emitting diode display according to the first embodiment of the present invention. FIG. 5 is a cross-sectional view taken along the line V-V of FIG. 4.

As shown in FIGS. 4 and 5, each pixel of the display panel includes a switching thin film transistor 10, a driving thin film transistor 20, a capacitor 80, and an organic light emitting diode 130. As such, the switching thin film transistor 10, the driving thin film transistor 20 and the capacitor 80 constitute the driving circuit part 120. The driving circuit part 120 further includes a gate line 151 disposed in one direction of the substrate body 110, and a data line 171 and a common power line 172 disposed to be insulated from and to intersect the gate line 151. As such, each pixel may be defined by the gate line 151, the data line 171 and the common power line 172, but the present invention is not necessarily limited thereto.

The organic light emitting diode 130 includes a first electrode 310, an organic light emitting layer 320 formed on the first electrode 310, and a second electrode 330 formed on the organic light emitting layer 320. The first electrode 310 is a positive (+) electrode which is a hole injection electrode, and the second electrode 330 is a negative (−) electrode that is an electron injection electrode. However, an embodiment of the present invention is not necessarily limited thereto, and the first electrode 310 may be a negative electrode and the second electrode 330 may be a positive electrode depending on the driving method of the display 101. The holes and the electrons are injected into the organic light emitting layer 320 from the first electrode 310 and the second electrode 330, respectively, after which excitons which are combinations of holes and electrons injected into the organic light emitting layer 320 are dropped from the excited state to the ground state, thereby achieving light emission of the organic light emitting layer 320.

Also in the organic light emitting diode display 101 according to the first embodiment of the present invention, the display panel (DP) emits light in the direction of the second substrate 200. That is, the organic light emitting diode 130 is of a front light-emission type. As such, in order for the organic light emitting diode 130 to emit light in the direction of the second substrate 200, the first electrode 310 is formed of a light-reflecting conductive material, and the second electrode 330 is formed of a light-transmitting conductive material.

The capacitor 80 includes a pair of capacitor plates 158, 178 disposed on both sides of an interlayer insulating film 161. As such, the interlayer insulating film 161 is dielectric, and the capacitance of the capacitor 80 is determined by charges accumulated on the capacitor 80 and voltage between both the capacitor plates 158, 178.

The switching thin film transistor 10 includes a switching semiconductor layer 131, a switching gate electrode 152, a switching source electrode 173 and a switching drain electrode 174. The driving thin film transistor 20 includes a driving semiconductor layer 132, a driving gate electrode 155, a driving source electrode 176 and a driving drain electrode 177.

The switching thin film transistor 10 is used as a switching device that selects pixels to be emitted. The switching gate electrode 152 is connected to the gate line 151. The switching source electrode 173 is connected to the data line 171. The switching drain electrode 174 is spaced apart from the switching source electrode 173 and is connected to any one capacitor plate 158.

The driving thin film transistor 20 applies the driving power, which is required to emit light from the organic light emitting layer 320 of the organic light emitting diode 130 in the selected pixel, to the first electrode 310. The driving gate electrode 155 is connected to the capacitor plate 158 linked with the switching drain electrode 174. The driving source electrode 176 and the other capacitor plate 178 are connected to the common power line 172. The driving drain electrode 177 is connected to the first electrode 310 of the organic light emitting diode 130 via a contact hole.

By means of such a structure, the switching thin film transistor 10 is operated by the gate voltage applied to the gate line 151 to thus transfer the data voltage applied to the data line 171 to the driving thin film transistor 20. The voltage corresponding to a difference between the common voltage applied to the driving thin film transistor 20 from the common power line 172 and the data voltage transferred from the switching thin film transistor 10 is stored in the capacitor 80, and current corresponding to the voltage stored in the capacitor 80 flows to the organic light emitting diode 130 via the driving thin film transistor 20, thus emitting light from the organic light emitting diode 130.

Referring to FIGS. 1 to 3 again, the integrated circuit chip 300 is mounted on the edge of the first substrate 100 in a chip-on-glass type by means of an interconnection member such as an anisotropic conductive film (ACF), etc. The integrated circuit chip 300 transmits the driving signal to the driving circuit part 120 of the first substrate 100.

The connection unit 400 is a flexible printed circuit board, and includes a circuit board body 410 on which the electronic device 500 is positioned, a connector part 420 provided with a connector 421 that receives an external signal, and a substrate connection part 430 electrically connected to a portion of the edge of the first substrate 100. The connection unit 400 transfers a driving signal, which is generated from the circuit board body 410 on which the electronic device 500 is positioned, to the integrated circuit chip 300 via the substrate connection part 430, or directly transmits a driving signal to the driving circuit part 120. The circuit board body 410 of the connection unit 400 is extended to the rear side of the first substrate 100, as shown in FIG. 3. The electronic device 500 is positioned on the circuit board body 410 extended to the rear side of the first substrate 100, and the circuit board body 410 of the connection unit 400 that faces the reception unit 600 is adhered to the reception unit 600 by an adhesive (AD).

The electronic device 500 is positioned between the connection unit 400 and the first substrate 100, and faces the first substrate 100 through a through bore 610 of the reception unit 600 which will be described later. The electronic device 500 generates electromagnetic waves in the course of processing the driving signal.

Processing the driving signal includes a series of procedures of formation, transformation and transmission of a driving signal.

The reception unit 600 accommodates the first substrate 100 and the second substrate 200 in such a manner that these substrates are enclosed therein. The connection unit 400 is bendably extended from the first substrate 100 at the rear side of the reception unit 600. The reception unit 600 includes the through bore 610 that exposes the first substrate 100 to the rear side of the reception unit 600. The electronic device 500 positioned on the connection unit 400 passes trough the through bore 610 of the reception unit 600 and thus directly faces the first substrate 100. The reception unit 600 may be formed using a variety of materials and processes. For example, the reception unit 600 may be made using a highly rigid material, namely, a metal material such as stainless steel, cold rolling steel, aluminum, aluminum alloy, nickel alloy, magnesium, magnesium alloy, etc. The metal plate made using such a metal material may be formed into the reception unit 600 using a known method of deep drawing or bending. The electromagnetic wave-shielding sheet 700 is positioned between the first substrate 100 and the electronic device 500 facing the first substrate 100 via the reception unit 600.

The electromagnetic wave-shielding sheet 700 may be attached to the rear side of the first substrate 100. The electromagnetic wave-shielding sheet 700 is applied only onto the region that corresponds to the electronic device 500 on the rear side of the first substrate 100 through the through bore 610, and thus directly faces the electronic device 500. The electromagnetic wave-shielding sheet 700 is located between the first substrate 100 and the electronic device 500 so as to suppress the electromagnetic waves generated in the direction of the first substrate 100 upon processing of the driving signal by the electronic device 500.

Figure 6:
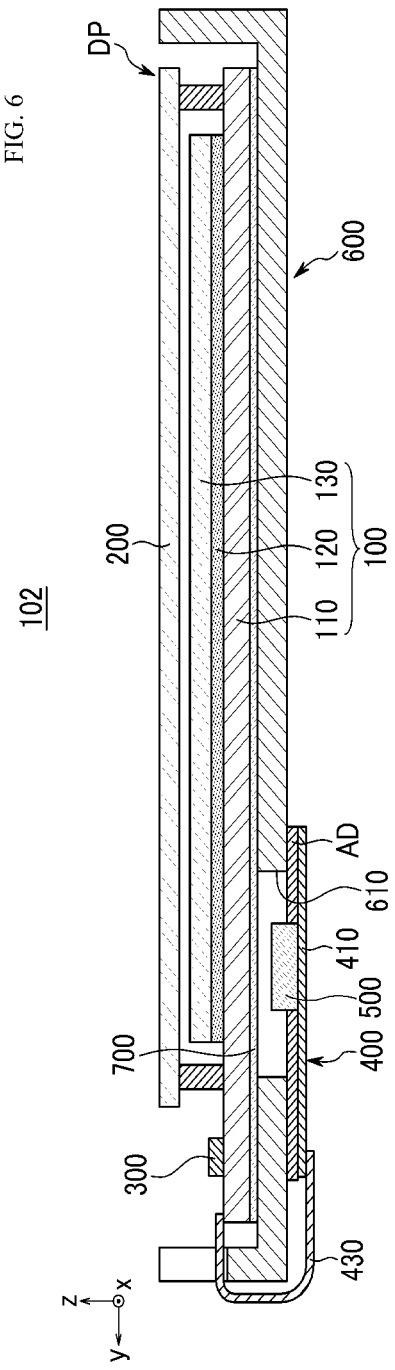
FIG. 6 is a cross-sectional view showing an organic light emitting diode display according to a second embodiment of the present invention.

As shown in FIG. 6, an organic light emitting diode display 102 according to another embodiment of the present invention includes the electromagnetic wave-shielding sheet 700 positioned between the first substrate 100 and the reception unit 600.

Although FIGS. 3 and 6 illustrate embodiments wherein the electromagnetic wave-shielding sheet 700 is attached to the rear side of the first substrate, the electromagnetic wave-shielding sheet 700 may be attached onto the connection unit 400. Briefly, the electromagnetic wave-shielding sheet 700 may be attached onto the circuit board body 410 including the electronic device 500.

Figure 7:
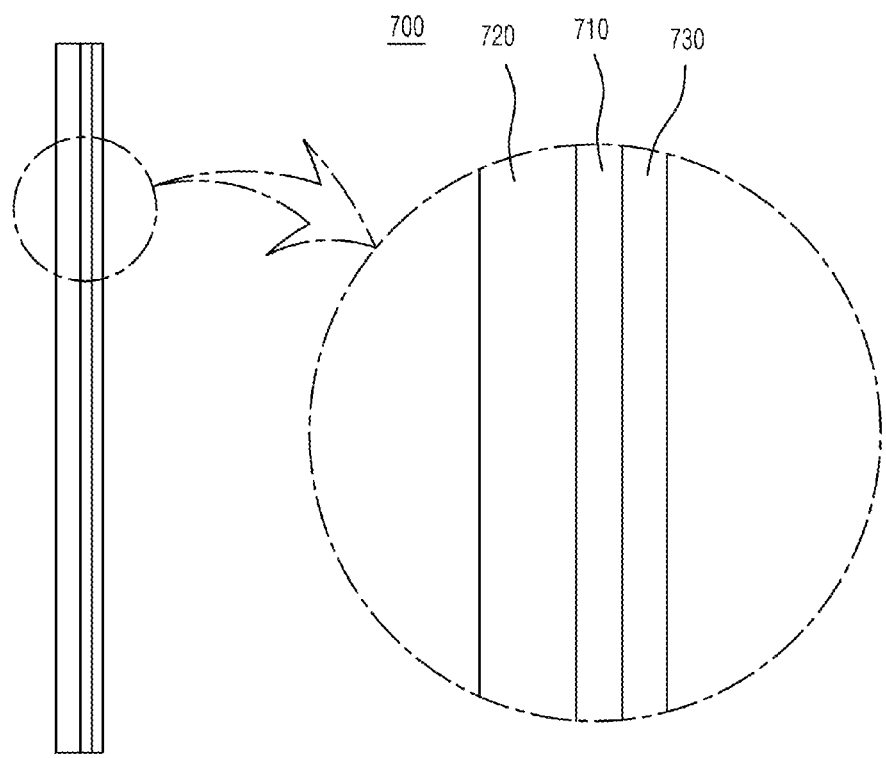
FIG. 7 is a cross-sectional view showing the structure of an electromagnetic wave-shielding sheet according to an embodiment of the present invention.

As shown in FIG. 7, the electromagnetic wave-shielding sheet 700 may include a conductive material layer 710 of a single metal, alloy or graphite. The conductive material layer 710 may include at least one selected from the group consisting of gold (Au), silver (Ag), copper (Cu), aluminum (Al), titanium (Ti), indium tin oxide (ITO), indium zinc oxide (IZO), carbon nanotubes (CNTs), and graphite.

In the conductive material layer 710, the graphite may be pyrolytic graphite or exfoliated graphite.

Exfoliated graphite having superior electromagnetic wave-shielding performance and heat conductivity in a planar direction is manufactured as below.

Specifically, exfoliated graphite is manufactured by intercalating natural flake graphite using a mixture solution of sulfuric acid and hydrogen peroxide thus forming an interlayer compound, instantly expanding the interlayer compound in a furnace at high temperature to thus make multilayered graphene which is then rolled.

The exfoliated graphite is formed using roller compression molding under conditions of an expansion volume of about 180~250 ml/g and a compression rate of 30% or more. After the roller compression molding, the density of the sheet may be 0.8~1.25 g/cm$^3$, and may be adjusted by the pressure that is applied to the rollers and the expanded particles, and the thickness thereof may be 0.1~6.0 mm. If the sheet becomes thicker, the density cannot but decrease.

Accordingly, the exfoliated graphite sheet greatly expands to an expansion volume of 250 ml/g or more, and the use of vibration pressing or the addition of dense amorphous nano-carbon is preferable in order to decrease the porosity (heat conductivity of air: 0.028 W/mK).

Upon typical roller compression molding, the surface density increases more rapidly than the inner density, and thus it is difficult to discharge air from the surface or the lower side. As the remaining inner air is discharged through both lateral sides of the sheet to be roller compressed or in the direction opposite the traveling direction of the sheet, the density of the sheet may increase. However, if the thickness of the sheet is increased, the inner density may become much lower than the surface density, making it difficult to diffuse heat, undesirably resulting in poor heat dissipation performance.

Hence, it is preferred that the exfoliated graphite be gradually compressed via several vibrations per second using a vibration press at the same time of being subjected to roller compression, so that the surface density or the inner density is made more uniform.

Meanwhile, to minimize the porosity in the exfoliated graphite sheet, it is preferred that, in the course of compressing the exfoliated graphite sheet, the exfoliated graphite is filled with a filler, namely dense amorphous nano-carbon or graphite particulate powder, depending on the thickness of the sheet, and then compressed.

Graphite typically has a theoretical density of about 2.27 g/cm$^3$, and the density of the exfoliated graphite sheet obtained by subjecting the exfoliated graphite to roller compression is 0.8~1.25 g/cm$^3$.

On the other hand, pores corresponding to about 45~65% of the theoretical density of graphite are left behind in the graphite sheet. Such amorphous carbon particles preferably increase the density of a molded body in the compression molding process, thus increasing heat to diffusivity and heat conductivity. The amorphous carbon particles may decrease the presence of the pores corresponding to about 45~65% of the theoretical density to 15~55%, and thus may control heat conductivity depending on the density.

The particle size of dense amorphous nano-carbon or graphite particulate powder is not particularly limited, but is preferably 10~110 nm. When using amorphous carbon particles having such a size, heat dissipation effects may be maximized and they may easily penetrate between the graphite particles upon compression molding of the graphite. Furthermore, the addition of 5~30 wt % of the dense amorphous nano-carbon based on the total amount of the exfoliated graphite before roller compression may result in decreased porosity, whereby the density of the sheet may be increased to 1.0~2.0 g/cm$^3$. Consequently, the heat conductivity of the graphite sheet is 400~1900 W/mK in the planar direction and 3~20 W/mK in the perpendicular direction.

The conductive material layer 710 may be formed using any one selected from among a deposition process such as chemical vapor deposition or the like, a plating process such as electroplating or electroless plating, and a printing process.

The electromagnetic wave-shielding sheet 700 may include a buffer layer 720 which is applied on at least one side of the conductive material layer 710 to absorb the impact that is applied to the reception unit 600 so as to prevent the first substrate 100 from breaking.

The buffer layer 720 preferably comprises a polyurethane resin or a graphite-containing polyurethane resin. The buffer layer 720 preferably has a thickness of 70~350 an to exert its buffer action.

The preparation of the graphite-containing polyurethane resin is described below.

The exfoliated graphite obtained per the above is immersed in an organic solvent containing a dispersant, and then subjected to sonication and milling. The organic solvent used is at least one selected from the group consisting of dimethylformamide (DMF), methylethylketone (MEK), toluene, and acetone. The dispersant may be exemplified by an organic compound such as sodium dodecyl sulfate (SDS). The materials and the composition used in the preparation of the dispersion are shown below (Table 1).

TABLE 1

| Materials | Sample 1 unit: mole | Sample 2 | Sample 3 |
|---|---|---|---|
| Polycarbonate Diol | 0.3 | 0.3 | 0.3 |
| Diisocyanate (MDI) | 1 | 1 | 1 |
| 1,4-Butanediol | 0.4 | 0.4 | 0.4 |
| Diethylene Glycol | 0.3 | 0.3 | 0.3 |
| Exfoliated graphite/DMF dispersion | 150 g | 150 g | 150 g |
| Amount of Exfoliated graphite | 3 wt % | 5 wt % | 7 wt % |

Next, the exfoliated graphite dispersion and the polyol are reacted with diisocyanate thus preparing a prepolymer, which is then chain-extended.

Further, mixing the polyol, the diol and the catalyst at 75~85° C. (preferably about 80° C.) for 30 min, adding diisocyanate to form a prepolymer at 75~85° C. (preferably about 80° C.) for 3~5 hr, dividedly adding the exfoliated graphite dispersion 3~8 times, and adding a chain extender to the identified —NCO terminal of the prepolymer are performed.

The polyol is at least one selected from the group consisting of polyester polyol, polycarbonate diol, polypropylene glycol, polyethylene glycol, poly(tetramethylene)glycol, and polycarprolactone glycol. The diol is at least one selected from the group consisting of 1,4-butanediol, ethylene glycol, diethylene glycol, and 1,6-hexanediol. The chain extender is at least one selected from the group consisting of ethylene diamine, ethylene triamine, 1,4-butanediol, ethylene glycol, diethylene glycol, and 1,6-hexanediol.

Because the viscosity increases upon forming the prepolymer via polycondensation, the exfoliated graphite dispersion is added while the viscosity of the prepolymer is kept within the range of 100,000~150,000 cps, thus increasing the molecular weight.

The urethane group is primarily produced in the added exfoliated graphite sheet, and as the polycondensation continues, the polyurethane prepolymer may be intercalated between graphite sheets, or the intercalated polyurethane prepolymer may be formed into a polymer via chain extension, and the graphite sheet is exfoliated.

Thereby, the aggregation of graphite may be prevented, and the graphite thin film having a nano-sized thickness is dispersed in the polyurethane resin, thus forming a graphite-dispersed polyurethane resin which exhibits electrical conductivity and heat conductivity as well as buffer action.

Meanwhile, in the case where the conductive material layer 710 does not include a buffer layer 720 on the other side thereof, an adhesive layer 730 for adhering the electromagnetic wave-shielding sheet 700 to the reception unit 600 or the first substrate 100 may be applied on the conductive material layer 710.

Although not shown, an adhesive layer may also be applied on the buffer layer 720.

The kind of adhesive polymer resin used in the adhesive layer 730 is not particularly limited, and any resin may be used so long as in the art it may be used as an adhesive. For example, an adhesive polymer resin such as silicones, acryls, urethanes, etc., may be used, and an acrylic resin is preferably used.

Specifically, examples of the acrylic resin include a polymer resulting from copolymerizing a (meth)acrylic acid ester monomer having a C1~C12 alkyl group and a polar monomer copolymerizable with the above monomer.

The non-limited examples of the (meth)acrylic acid ester monomer include butyl (meth)acrylate, hexyl (meth)acryalte, n-octyl (meth)acrylate, isooctyl (meth)acrylate, 2-ethylhexyl (meth)acrylate, isononyl (meth)acrylate, etc.

The non-limited examples of the polar monomer copolymerizable with the (meth)acrylic acid ester monomer include monomers containing a carboxylic group such as (meth) acrylic acid, maleic acid, fumaric acid or the like, or monomers containing nitrogen such as acrylamide, N-vinylpyrrolidone, N-vinylcaprolactam, etc. Such a polar monomer imparts cohesion to the adhesive layer and may enhance adhesive force.

In the adhesive polymer resin, the weight ratio of the (meth)acrylic acid ester monomer to the polar monomer is not particularly limited but may fall in the range of 99~80:1~20. The acrylic resin in the above range may exhibit the adhesive force required of an adhesive layer.

Examples of the heat conductive filler usable in the present invention may include metal oxides, metal hydroxides, metal nitrides, metal carbides, boron compounds, graphite, etc., and specifically, $Al(OH)_3$, graphite, BN, $Al_2O_3$, silicon carbide, sendust (Al: 6 wt %, Si: 9 wt %, Fe: 85 wt %), etc., which may be used in mixtures thereof. The kind of the heat conductive filler is not limited thereto. In particular graphite has superior planar diffusion properties due to the structural features thereof, thus achieving high planar heat transfer properties. When such a graphite is used in a mixture with another heat conductive filler, excellent effects may manifest themselves. The adhesive layer may include 3~60 wt % of graphite, but to enhance the adhesive force, the use of 3~40 wt % of graphite is preferable.

Figure 8:
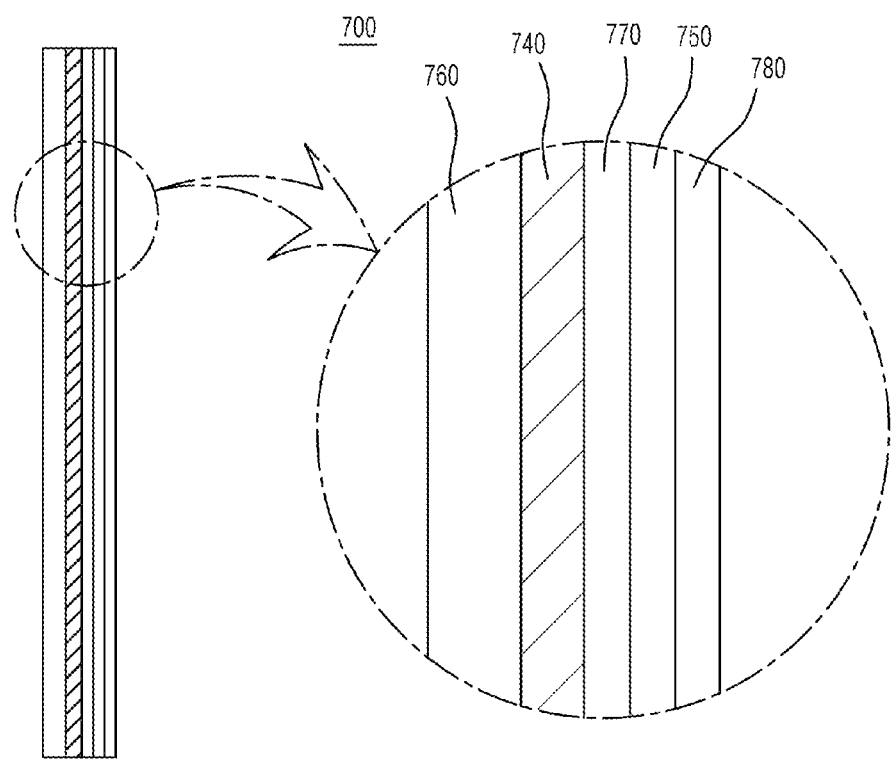
FIG. 8 is a cross-sectional view showing the structure of an electromagnetic wave-shielding sheet according to another embodiment of the present invention.

As shown in FIG. 8, the electromagnetic wave-shielding sheet 700 may include two conductive material layers formed of different types of materials in order to more efficiently shield electromagnetic waves and dissipate heat.

For example, the electromagnetic wave-shielding sheet 700 includes a first conductive material layer 740 comprising graphite and a second conductive material layer 750 comprising metal, and an adhesive layer 770 comprising the above material is interposed between the first conductive material layer 740 and the second conductive material layer 750.

The buffer layer 760 as above may be applied on at least one side of the first conductive material layer 740 and the second conductive material layer 750. Also, the adhesive layer 780 for adhering the electromagnetic wave-shielding sheet 700 to the reception unit 600 or the first substrate 100 may be applied on the side of the first conductive material layer 740 and the second conductive material layer 750 opposite the side on which the buffer layer 760 is applied. Although not shown, the adhesive layer may also be applied on the buffer layer 760.

The electromagnetic wave-shielding sheet 700 may be grounded to the reception unit 600.

The organic light emitting diode display 101 according to the embodiments of the present invention is configured such that the electronic device 500 passes through the through bore 610 of the reception unit 600 in the direction of the rear side of the reception unit 600, thus achieving a slim organic light emitting diode display 101.

The electronic device 500 is positioned on the connection unit 400 which is held onto the reception unit 600 by the adhesive (AD), and the electronic device 500 passes through the through bore 610 and is thus positioned in the reception unit 600, and thus the electronic device 500 is protected from external impacts and as well may be prevented from being damaged due to interference between the reception unit 600 and the electronic device 500.

Meanwhile, to improve heat dissipation properties of the reception unit 600, a graphite sheet may be further attached onto one side of the reception unit 600 (not shown). The graphite sheet is preferably attached to the rear side of the reception unit 600 together with the circuit board body 410.

Also, the graphite sheet may be attached to the side of the circuit board body 401 opposite the side when the electronic device 500 is mounted, in order to dissipate heat generated from the electronic device.

Figure 9:
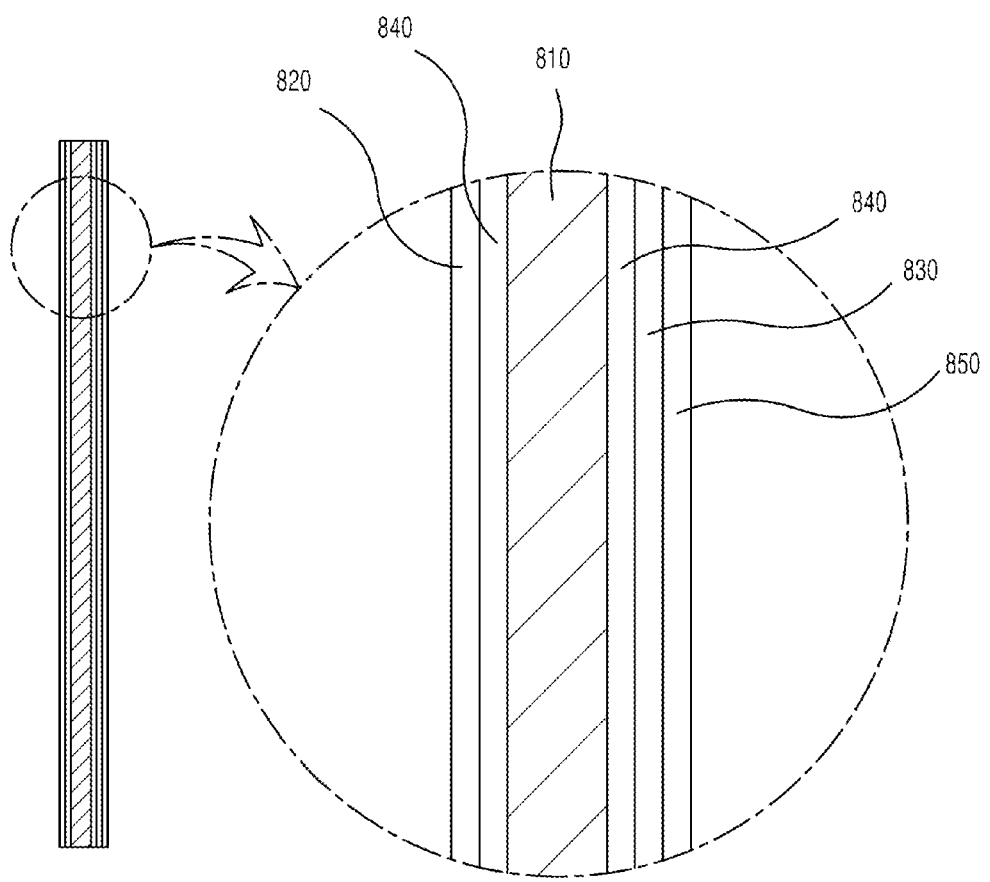
FIG. 9 is a cross-sectional view showing the structure of a graphite sheet according to a further embodiment of the present invention.

As shown in FIG. 9, the graphite sheet 800 includes a graphite layer 810, and support films 820, 830 formed on one or more sides of the graphite layer 810, and the support films 820, 830 include adhesive layers 840, 850 on one or more sides thereof. The graphite layer 810 comprises pyrolytic graphite or exfoliated graphite as described above.

The support films 820, 830 may be a polymer film made of PET, PE or PI, or a metal film. For example, the metal film is made of at least one selected from among gold (Au), silver (Ag), copper (Cu), aluminum (Al), titanium (Ti), indium tin oxide, and indium zinc oxide, which are conductive materials as described above. The adhesive layer 840 interposed between the exfoliated graphite layer 810 and the support films 820, 830 is made of an adhesive as above, and functions to bind the graphite layer 810 and the support films 820, 830.

The thickness of the support films 820, 830 is preferably 5~50 μm. In order to inhibit flaking of the particles of graphite, as not shown in Figs., the area of the support films 820, 830 is preferably larger than the area of graphite layer 810, and the support films 820, 830 cover and extend beyond at least one of the edge of the graphite layer 810 to form a seal or a protective boundary.

The adhesive layers 840, 850 may be made of a typical adhesive, but the use of an adhesive comprising the heat conductive polymer resin which is specified above is preferable.

The thickness of the adhesive layers 840, 850 is preferably 2~20 μm.

As mentioned above, the organic light emitting diode display 101 according to the embodiments of the present invention is configured such that the electromagnetic wave-shielding sheet 700 is disposed between the electronic device 500 and the first substrate 100 to shield electromagnetic waves generated from the electronic device 500. Thereby, the driving circuit part 120 may be prevented from malfunctioning as a result of the electromagnetic waves generated from the electronic device 500 being transferred to the driving circuit part 120 via the first substrate 100. As well, the electromagnetic waves generated from the electronic device 500 are prevented from being transferred to the outside of the organic light emitting diode display 101 via the first substrate 100, whereby the electromagnetic waves transferred to the outside are prevented from adversely affecting the body of a user who uses the organic light emitting diode display 101.

Also, heat generated from the organic light emitting diode display 101 is rapidly dissipated via the reception unit 600 by the electromagnetic wave-shielding sheet 700 or the graphite sheet and may absorb the external impact applied to the reception unit 600.

As described hereinbefore, the present invention provides an organic light emitting diode display. According to the present invention, an electromagnetic wave-shielding sheet is formed on a substrate, so that electromagnetic waves generated from an electronic device are blocked, thereby preventing the electromagnetic waves from rendering the organic light emitting diode display defective.

Also according to the present invention, a buffer layer is formed on the electromagnetic wave-shielding sheet, thus preventing the organic light emitting diode display from being broken by an external impact.

Also according to the present invention, a heat-dissipating graphite sheet is included in a reception unit, so that heat generated from the organic light emitting diode display can be rapidly emitted via the reception unit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic light emitting diode display, comprising:
   a first substrate including an organic light emitting diode and a driving circuit part for driving the organic light emitting diode;
   a second substrate disposed to face the first substrate and covering the organic light emitting diode and the driving circuit part;
   a connection unit connected to the driving circuit part and extending from the first substrate along a rear side thereof;
   an electronic device disposed between the connection unit and the first substrate and transmitting a signal to the driving circuit part via the connection unit; and
   an electromagnetic wave-shielding sheet disposed between the electronic device and the first substrate, wherein the electromagnetic wave-shielding sheet includes a graphite layer, a buffer layer formed on one side of the graphite layer, and a first adhesive layer formed on the other side of the graphite layer,
   wherein the graphite layer has a density of 1.0~2.0 g/cm$^3$, and has a heat conductivity of 400~1900 W/mK in a planar direction and of 3~20 W/mK in a perpendicular direction.

2. The organic light emitting diode display of claim 1, wherein the graphite layer comprises exfoliated graphite and amorphous carbon particles having a particle size of 10~110 nm, and an amount of the amorphous carbon particles is 5~30 wt % based on a total weight of the exfoliated graphite and the amorphous carbon particles.

3. The organic light emitting diode display of claim 1, wherein the buffer layer comprises a polyurethane resin.

4. The organic light emitting diode display of claim 3, wherein the polyurethane resin further comprises 3~5 wt % of graphite, and has a thickness of 70~350 μm.

5. The organic light emitting diode display of claim 1, wherein the adhesive layer comprises 3~40 wt % of graphite.

6. The organic light emitting diode display of claim 1, further comprising:
   a conductive material layer formed on the first adhesive layer using a material different from the graphite layer; and
   a second adhesive layer formed on the conductive material layer.

7. The organic light emitting diode display of claim 1, further comprising a reception unit which encloses at least a portion of the first substrate and includes a through bore through which the electronic device passes so that the electronic device and the first substrate face each other.

8. The organic light emitting diode display of claim 7, wherein the electromagnetic wave-shielding sheet is disposed between the first substrate and the reception unit.

9. The organic light emitting diode display of claim 7, wherein the connection unit which faces the reception unit is adhered to the reception unit using an adhesive.

10. The organic light emitting diode display of claim 1, wherein the connection unit is a flexible printed circuit board (FPCB).

11. The organic light emitting diode display of claim 6, wherein the conductive material layer comprises at least one selected from the group consisting of gold (Au), silver (Ag), copper (Cu), aluminum (Al), titanium (Ti), indium tin oxide (ITO), indium zinc oxide (IZO), and graphite.

\* \* \* \* \*